(12) United States Patent
Peng et al.

(10) Patent No.: US 10,964,774 B2
(45) Date of Patent: Mar. 30, 2021

(54) BACKPLANE FOR ORGANIC LIGHT EMITTING DISPLAY DEVICE AND METHOD FOR FABRICATING THE SAME, AND DISPLAY APPARATUS

(71) Applicants: BOE TECHNOLOGY GROUP CO., LTD., Beijing (CN); Ordos Yuansheng Optoelectronics Co. Ltd., Inner Mongolia (CN)

(72) Inventors: Liman Peng, Beijing (CN); Qi Liu, Beijing (CN); Jin Yang, Beijing (CN); Zihua Li, Beijing (CN); Yan Wu, Beijing (CN); Guoping Zhang, Beijing (CN); Haifeng Xu, Beijing (CN); Wenxiu Li, Beijing (CN); Lei Wang, Beijing (CN); Jianqiang Wang, Beijing (CN); Fan Yang, Beijing (CN)

(73) Assignees: BOE TECHNOLOGY GROUP CO., LTD., Beijing (CN); ORDOS YUANSHENG OPTOELECTRONICS TECHNOLOGY, CO., LTD., Inner Mongolia (CN)

( * ) Notice: Subject to any disclaimer, the term of this patent is extended or adjusted under 35 U.S.C. 154(b) by 31 days.

(21) Appl. No.: 15/970,996

(22) Filed: May 4, 2018

(65) Prior Publication Data

US 2019/0165082 A1 May 30, 2019

(30) Foreign Application Priority Data

Nov. 29, 2017 (CN) .......................... 201711228278.4

(51) Int. Cl.
*H01L 27/32* (2006.01)
*H01L 29/45* (2006.01)
*H01L 29/49* (2006.01)
*H01L 51/56* (2006.01)
(Continued)

(52) U.S. Cl.
CPC ...... *H01L 27/3279* (2013.01); *H01L 27/3262* (2013.01); *H01L 27/3276* (2013.01); *H01L 29/45* (2013.01); *H01L 29/4908* (2013.01); *H01L 51/56* (2013.01); *H01L 27/124* (2013.01);
(Continued)

(58) Field of Classification Search
None
See application file for complete search history.

(56) References Cited

U.S. PATENT DOCUMENTS

| | | | |
|---|---|---|---|
| 2011/0090184 A1* | 4/2011 | Yamazaki | G09G 3/36 345/204 |
| 2014/0347349 A1* | 11/2014 | Kim | G11C 19/28 345/213 |

(Continued)

*Primary Examiner* — Zandra V Smith
*Assistant Examiner* — Lawrence C Tynes, Jr.
(74) *Attorney, Agent, or Firm* — Calfee, Halter & Griswold LLP

(57) ABSTRACT

The present disclosure discloses a backplane for an organic light emitting display device, a method for fabricating the same, and an organic light emitting display apparatus. The backplane includes a substrate on which a wiring structure and a thin film transistor are provided, wherein the wiring structure includes an initializing voltage input line which is provided in the same layer and made of the same material as electrodes of the thin film transistor.

7 Claims, 4 Drawing Sheets

(51) Int. Cl.
*H01L 51/52* (2006.01)
*H01L 27/12* (2006.01)
(52) U.S. Cl.
CPC .... *H01L 51/5206* (2013.01); *H01L 2227/323* (2013.01)

(56) References Cited

U.S. PATENT DOCUMENTS

2014/0353616 A1* 12/2014 Park .................... G09G 3/3233
257/40
2015/0316802 A1* 11/2015 Takanishi .......... G02F 1/136227
349/43
2017/0317159 A1* 11/2017 Kim .................... H01L 27/1222

* cited by examiner

BACKPLANE FOR ORGANIC LIGHT EMITTING DISPLAY DEVICE AND METHOD FOR FABRICATING THE SAME, AND DISPLAY APPARATUS

CROSS REFERENCE

The present disclosure claims the priority of Chinese Patent Application No. 201711228278.4 filed on Nov. 29, 2017, entitled "BACKPLANE FOR ORGANIC LIGHT EMITTING DISPLAY DEVICE AND METHOD FOR FABRICATING THE SAME, AND DISPLAY APPARATUS". The entire contents of this application are incorporated herein by reference.

TECHNICAL FIELD

The present disclosure relates to the field of display technology, and in particular, to a backplane for an organic light emitting display device, a method for fabricating the same, and an organic light emitting display apparatus.

BACKGROUND

With the development of science and technology and the optimization of integrated circuit technology, organic light emitting diode (OLED) display apparatuses have become leaders in the display field by virtue of their outstanding performance. OLED display technology has been widely used in mobile terminals, tablet computers, notebook computers, car audios, and televisions because of its advantages such as self-light emission, wide viewing angle, high contrast, low power consumption, and high reaction speed.

However, backplanes currently used for organic light emitting display devices, methods for fabricating the same, and organic light emitting display apparatuses still need to be improved.

SUMMARY

In one aspect of the present disclosure, the present disclosure provides a backplane for an organic light emitting display device. According to an embodiment of the present disclosure, the backplane includes a substrate on which a wiring structure and a thin film transistor are provided, wherein the wiring structure includes an initializing voltage input line which is provided in the same layer and made of the same material as electrodes of the thin film transistor.

According to an embodiment of the present disclosure, the electrodes of the thin film transistor include a first electrode, a second electrode, and a control electrode. The initializing voltage input line is provided in the same layer and made of the same material as the first electrode, the second electrode or the control electrode.

According to an embodiment of the present disclosure, the first electrode and the second electrode are each and independently formed of at least one of titanium, chromium, molybdenum, tantalum, and aluminum.

According to an embodiment of the present disclosure, the initializing voltage input line is provided in the same layer and made of the same material as the first electrode or the second electrode.

According to an embodiment of the present disclosure, the control electrode is formed of at least one of titanium, chromium, molybdenum, and tantalum.

According to an embodiment of the present disclosure, the initializing voltage input line is provided in the same layer and made of the same material as the control electrode.

According to an embodiment of the present disclosure, the backplane further includes an organic light emitting diode that is disposed on the substrate. The wiring structure further includes a reference voltage input line which is provided in the same layer and made of the same material as an anode of the organic light emitting diode.

In another aspect of the present disclosure, the present disclosure provides an organic light emitting display apparatus. According to an embodiment of the present disclosure, the organic light emitting display apparatus includes any of the aforementioned backplanes.

In still another aspect of the present disclosure, the present disclosure provides a method of fabricating a backplane for an organic light emitting display device. According to an embodiment of the present disclosure, the method includes: providing a wiring structure and a thin film transistor on a substrate, wherein the wiring structure includes an initializing voltage input line, and the initializing voltage input line and electrodes of the thin film transistor are formed through same one patterning process. According to an embodiment of the present disclosure, the backplane fabricated by the method may be any of the backplanes described above, and thus may have all the features and advantages of the backplanes described above, which will not be repeated herein.

According to an embodiment of the present disclosure, the electrodes of the thin film transistor include a control electrode, and a first electrode and a second electrode which are disposed in same layer. The initializing voltage input line and the control electrode are formed through same one patterning process, or the initializing voltage input line and the first and the second electrodes are formed through same one patterning process.

BRIEF DESCRIPTION OF THE DRAWINGS

The above and/or additional aspects and advantages of the present disclosure will become apparent and easily understood from the following description of embodiments in conjunction with the accompanying drawings, in which.

LISTING OF REFERENCE NUMERALS

Figure 1:
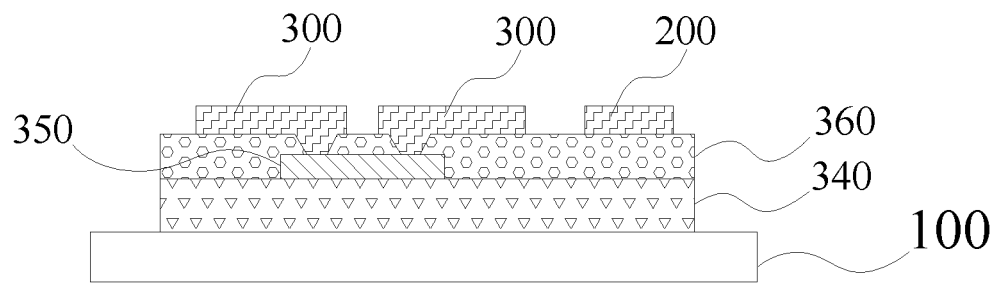
FIG. 1 shows a partial structural view of a backplane according to an embodiment of the present disclosure.
Figure 2:
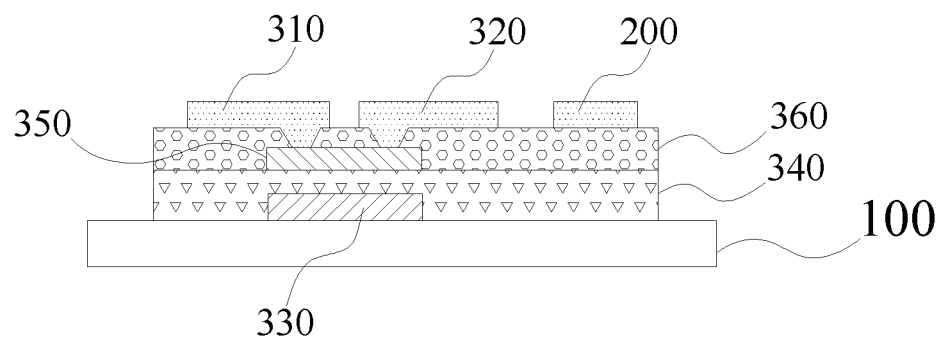
FIG. 2 shows a partial structural view of a backplane according to another embodiment of the present disclosure.
Figure 3:
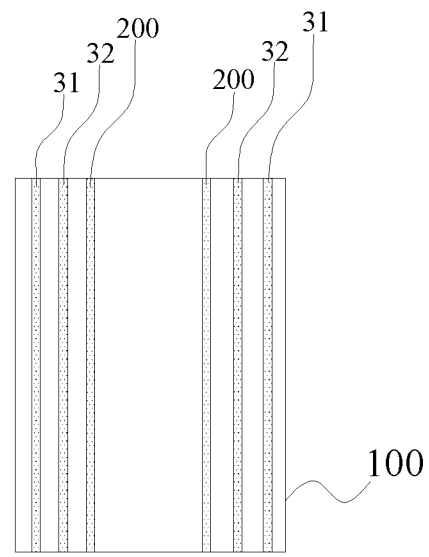
FIG. 3 shows a partial structural view of a wiring structure of a backplane according to an embodiment of the present disclosure.
Figure 4:
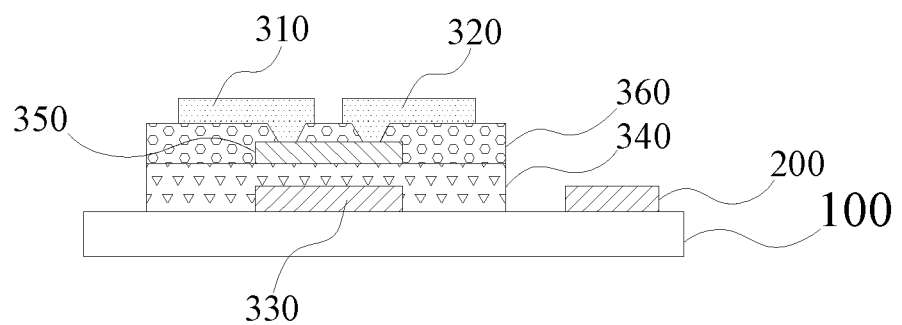
FIG. 4 shows a partial structural view of a backplane according to an embodiment of the present disclosure.
Figure 5:
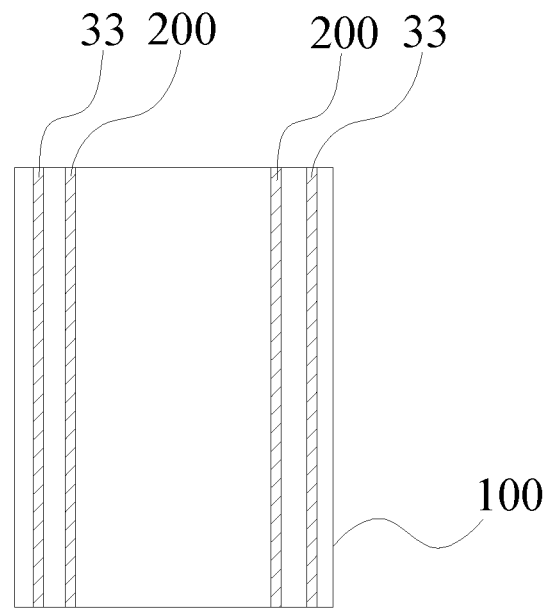
FIG. 5 shows a partial structural view of a wiring structure of a backplane according to an embodiment of the present disclosure.

100: substrate; 200: initializing voltage input line; 300: electrode of thin film transistor; 310: first electrode; 320:

second electrode; 330: control electrode; 31: first electrode line; 32: second electrode line; 33: control electrode line; 340: buffer layer; 350: active layer; 360: insulation layer; 400: reference voltage input line; 500: anode; 510: hole transport layer; 520: light emitting layer; 530: electron transport layer; 540: cathode; 50: anode line.

DETAILED DESCRIPTION

Embodiments of the present disclosure are described in detail below, examples of which are illustrated in the accompanying drawings, wherein the same or similar reference numerals denote the same or similar elements or elements having the same or similar functions throughout the drawings. The embodiments described below with reference to the accompanying drawings are exemplary, are used only for explaining the present disclosure, and should not be construed as limiting the present disclosure.

This disclosure is proposed based on the inventors' discovery and recognition of the following facts and problems.

The inventors have found that although the OLED display technology has been being increasingly developed and the fabricating process thereof is becoming more and more matured, the existing OLED display apparatuses still have many defects such as poor display. The inventors have found that the above-mentioned defects such as the horizontal stripe mura caused by arrangement of the OLED wiring (a phenomena of various tails caused by uneven brightness) are mainly because the existing OLEDs are mostly current-driven devices and are significantly influenced by the loading of various wirings, such as the data signal input (Vdata) line, the reference voltage input (Vref) line, the initializing voltage input (Vinit) line, etc. Fluctuation of the voltages on the above signal lines will influence the stable input of signals and the compensation of the switch threshold voltage (Vth) in the compensation circuit, resulting in uneven light emission of the OLED and horizontal stripe mura. Different wirings have different operating currents. For a wiring with a large operating current, when the wiring has a large resistance itself, its voltage will fluctuate greatly. More specifically, the inventors have found that the Vinit wiring has a large current when operating, and the anode with a large resistance is used to form the wiring, therefore the voltage fluctuation is large, which affects the stable input of signals and the compensation of Vth, resulting in uneven light emission and horizontal stripe mura. Therefore, if the above problems can be solved, the display effect of the OLED display apparatus will be greatly improved.

The present disclosure aims to alleviate or solve at least one of the above mentioned problems at least to some extent.

In one aspect of the present disclosure, the present disclosure provides a backplane for an organic light emitting display device. According to an embodiment of the present disclosure, referring to FIG. 1, the backplane includes a substrate 100 on which a wiring structure (not shown) and a thin film transistor (e.g., electrodes 300 of the thin film transistor, a buffer layer 340, an active layer 350, and an insulating layer 360 shown in FIG. 1) are provided. The wiring structure includes an initializing voltage input line 200 which is provided in the same layer and made of the same material as electrodes 300 of the thin film transistor. Thus, the backplane has at least one of the following advantages: the voltage signal of the initializing voltage input line is stable, which can significantly alleviate the horizontal stripe mura in the OLED; the structure of the backplane is simple, and can be obtained through a simple fabricating process, without significant change of the existing backplane fabricating process.

For easy understanding, the principle by which the backplane achieves the above technical effects will be described in detail below.

As described above, in the existing OLED display apparatus, the Vinit line is usually formed by the anode layer of the organic light emitting diode having a relatively large resistance. Since the anode layer of the organic light emitting diode needs both electric conductivity and light transmission, it has to be formed using ITO material. Since ITO has a large resistance (approximately $5.0 \times 10^{-4}$ $\Omega \cdot cm$), the horizontal stripe mura occurs. In order to improve the electric conductivity of the anode layer, other metals with high conductivity may be added to the anode material, for example, a composite material of three metal layers of ITO/Ag/ITO is used for the anode. However, since it has to consider at the same time the light transmission property of the anode layer, the improved anode layer still has a large resistance and cannot really alleviate the aforesaid problems caused by the large resistance of the Vinit line.

The inventors have found that if the Vinit line is provided in the same layer and made of the same material as electrodes of the thin film transistor, the above problems can be greatly alleviated. Generally, the material for forming the electrodes of the thin film transistor has a smaller resistance than the anode layer of the organic light emitting diode. For example, the Vinit line is formed of a composite material of three metal layers of Ti/Al/Ti, and the resistivity thereof is smaller (the resistivity of Al is $2.65 \times 10^{-6}$ $\Omega \cdot cm$, and the resistivity of Ti is $4.2 \times 10^{-5}$ $\Omega \cdot cm$), which can prevent the occurrence of horizontal stripe mura and improve the display effect. At the same time, the backplane according to the present embodiment has a simple structure, fabrication in the same layer does not need an additional process, and it does not have to significantly change the existing backplane fabricating process.

Various structures of the backplanes according to specific embodiments of the present disclosure will be described in detail below.

According to embodiments of the present disclosure, the specific material for the substrate 100 is not particularly limited, and those skilled in the art can make selection according to actual needs. For example, according to a specific embodiment of the present disclosure, the substrate 100 may be made of glass.

According to embodiments of the present disclosure, the specific features, structures, materials, or characteristics of the wiring structure and the thin film transistor are not particularly limited, so long as it is satisfied that the initializing voltage input line 200 in the wiring structure is provided in the same layer and made of the same material as electrodes 300 of the thin film transistor.

According to an embodiment of the present disclosure, referring to FIG. 2 to FIG. 5, the electrodes of the thin film transistor include a first electrode 310, a second electrode 320, and a control electrode 330. The initializing voltage input line 200 is provided in the same layer and made of the same material as the first electrode 310, the second electrode 320 or the control electrode 330. As such, the performance of the backplane can be further improved. According to an embodiment of the present disclosure, the initializing voltage input line 200 may be provided in the same layer and made of the same material as the first electrode 310 or the second electrode 320. As such, the initializing voltage input line 200 can be easily fabricated and the resistivity thereof is small, so that the occurrence of the horizontal stripe mura can be avoided. According to a specific embodiment of the present disclosure, referring to FIG. 2 (a sectional view of a backplane where there is a thin film transistor) and FIG. 3 (a top view of a backplane at a wiring structure), the first and second electrodes 310 and 320 may be a source and a drain of the thin film transistor, respectively. The source and the drain may be provided in the same layer. The initializing voltage input line 200 is provided in the same layer and made of the same material as the first electrode 310 and the second electrode 320. It should be noted that in FIG. 3, the initializing voltage input line 200 is also provided in the same layer and made of the same material as the first electrode line 31 and the second electrode line 32, with the first electrode line 31 used to be connected with the first electrode 310 and the second electrode line 32 used to be connected with the second electrode 320. According to an embodiment of the present disclosure, referring to FIG. 4 (a sectional view of a backplane where there is a thin film transistor) and FIG. 5 (a top view of a backplane at a wiring structure), the initializing voltage input line 200 may be provided in the same layer and made of the same material as the control electrode 330 (i.e., a gate of the thin film transistor). It should be noted that in FIG. 5, the initializing voltage input line 200 is also provided in the same layer and made of the same material as the control electrode line 33 (gate line), with the control electrode line 33 used to be connected with the control electrode 330. As such, the initializing voltage input line 200 can be easily fabricated and the resistivity thereof is small, so that the occurrence of horizontal stripe mura can be avoided.

According to embodiments of the present disclosure, the specific materials for forming the first electrode 310 and the second electrode 320 are not particularly limited, and those skilled in the art can make selection according to actual needs. For example, according to an embodiment of the present disclosure, the first electrode 310 and the second electrode 320 may be each and independently formed of at least one of titanium, chromium, molybdenum, tantalum, and aluminum. Thus, the above-described electrodes can be formed using the above-mentioned material having a low resistivity, so that the performance of the backplane can be further improved. According to an embodiment of the present disclosure, the first and second electrodes 310 and 320 may be each and independently formed of a composite material of multi metal layers, i.e., a structure having multi layers of metals, wherein each metal layer may be made of at least one of titanium, chromium, molybdenum, tantalum, and aluminum. Specifically, each metal layer may be independently formed of at least one of titanium, chromium, molybdenum, tantalum, aluminum, a titanium alloy, a chromium alloy, a molybdenum alloy, and a tantalum alloy. More specifically, the first electrode 310 and the second electrode 320 may be each and independently of a multi-layered composite structure formed of three metal layers of Ti/Al/Ti. According to an embodiment of the present disclosure, when the initializing voltage input line 200 is provided in the same layer and made of the same material as the first electrode 310 and the second electrode 320, the initializing voltage input line 200 may have the same features, structure, material or characteristics as the first electrode 310 and the second electrode 320.

According to embodiments of the present disclosure, the specific material for forming the control electrode 330 is not particularly limited, and those skilled in the art can make selection according to actual needs. For example, according to an embodiment of the present disclosure, the control electrode 330 may be formed of at least one of titanium, chromium, molybdenum, and tantalum. As such, the performance of the backplane can be further improved. Specifically, according to an embodiment of the present disclosure, the control electrode 330 may be made of molybdenum. According to an embodiment of the present disclosure, when the initializing voltage input line 200 is provided in the same layer and made of the same material as the control electrode 330, the initializing voltage input line 200 may have the same features, structure, material, or characteristic as the control electrode 330.

Figure 6:
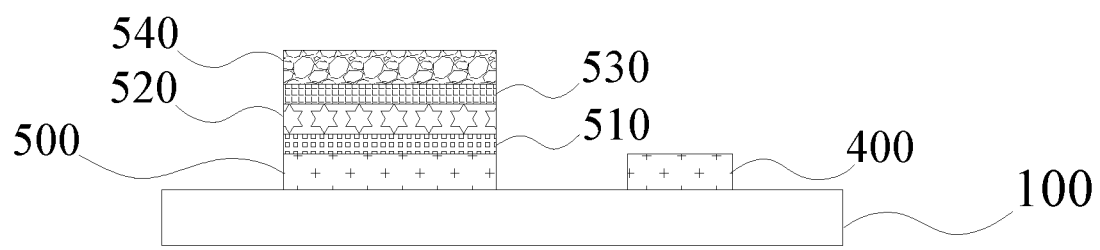
FIG. 6 shows a partial structural view of a backplane according to an embodiment of the present disclosure.
Figure 7:
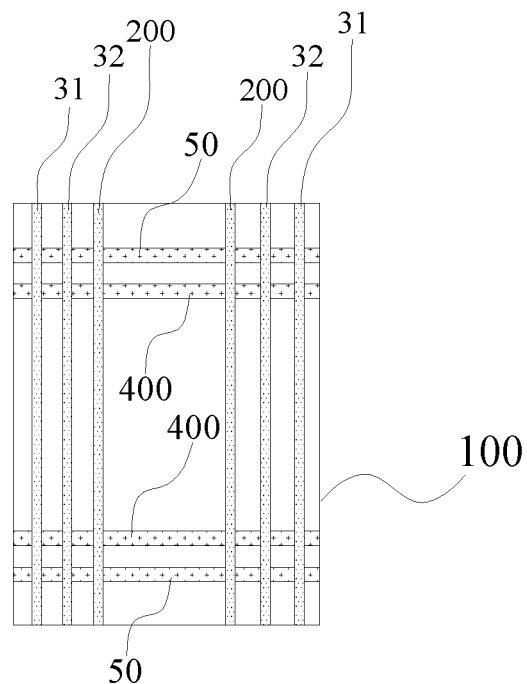
FIG. 7 shows a partial structural view of a wiring structure of a backplane according to an embodiment of the present disclosure.

According to an embodiment of the present disclosure, referring to FIG. 6 (a sectional structural view of a partial structure of a backplane), the backplane further includes an organic light emitting diode (e.g., an anode 500, a hole transport layer 510, a light emitting layer 520, an electron transport layer 530 and a cathode 540 shown in FIG. 6). The organic light emitting diode is provided on the substrate 100. The wiring structure further includes a reference voltage input line 400 which is provided in the same layer and made of the same material as the anode 500 of the organic light emitting diode. Thus, the reference voltage input line and the initializing voltage input line can be conveniently layered to further increase the opening ratio of the OLED. Specifically, referring to FIG. 7 (a top view of a partial wiring structure of the backplane) and taking it as an example that the initializing voltage input line 200 is provided in the same layer and made of the same material as the first electrode 310 and the second electrode 320, that is, the initializing voltage input line 200 is provided in the same layer and made of the same material as the first electrode line 31 and the second electrode line 32, and the reference voltage input line 400 is provided in the same layer and made of the same material as the anode line 50, wherein the anode line 50 is used to be connected with the anode 500. In the existing backplane for an OLED display apparatus, the reference voltage input line 400 is usually provided in the same layer as the source and drain of the thin film transistor. According to an embodiment of the present disclosure, the reference voltage input line 400 is provided in the same layer and made of the same material as the anode 500 and the anode line 50, and the reference voltage input line 400 and the initializing voltage input line 200 can be made to be provided in different layers. Therefore, when the backplane is used to manufacture a high resolution product, the reference voltage input line 400 and the initializing voltage input line 200 may be made to be partially overlapped or completely overlapped in a direction perpendicular to the substrate, and thus the footprint area of the wiring structure may be reduced in case of dense pixel arrangement, further increasing the opening ratio of the OLED. In addition, the current applied to the reference voltage input line 400 is small, and thus the resistance of the wire itself has little influence on the voltage of the circuit and will not cause a significant fluctuation of the circuit voltage, so that even if the reference voltage input line 400 is formed using the anode layer material with a large resistance, the performance of the backplane will not be adversely affected.

According to embodiments of the present disclosure, the specific features, structures, materials, or characteristics of the aforesaid organic light emitting diode are not particularly limited, so long as it is satisfied that the reference voltage input line 400 is provided in the same layer and made of the same material as the anode 500 of the organic light emitting diode. According to embodiments of the present disclosure, the specific materials for forming the anode 500 and the reference voltage input line 400 are not particularly limited, and those skilled in the art can make selection according to actual needs. For example, according to an embodiment of the present disclosure, the anode 500 and the reference voltage input line 400 may each and independently be formed of a composite material of three metal layers of ITO/Ag/ITO.

Figure 8:
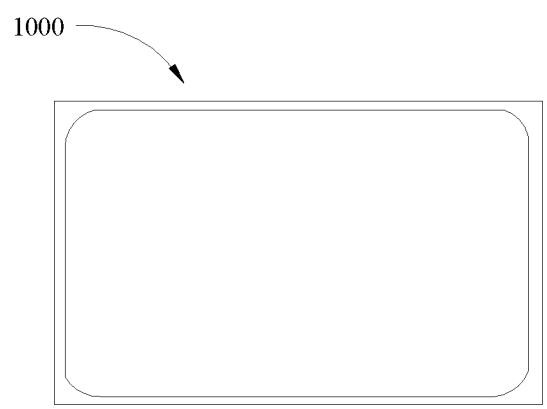
FIG. 8 shows a structural view of an organic light emitting display apparatus according to an embodiment of the present disclosure.

In another aspect of the present disclosure, referring to FIG. 8, the present disclosure provides an organic light emitting display apparatus 1000. According to an embodiment of the present disclosure, the organic light emitting display apparatus 1000 includes any of the aforementioned backplanes. Therefore, the organic light emitting display apparatus 1000 may have all the features and advantages of the backplane described above, which will not be repeated herein. In general, the organic light emitting display apparatus has at least one of the following advantages: the voltage signal of the initializing voltage input line is stable, which can significantly alleviate the horizontal stripe mura in the OLED; the structure of the backplane in the organic light emitting display apparatus is simple, and can be obtained through a simple fabricating process, without significant change of the existing backplane fabricating process.

In still another aspect of the present disclosure, the present disclosure provides a method of fabricating a backplane for an organic light emitting display device. According to an embodiment of the present disclosure, the backplane fabricated by the method may be the backplane described above, and thus may have all the features and advantages of the backplane described above, which will not be repeated herein. In general, with the method the initializing voltage input line and electrodes of the thin film transistor can be easily fabricated in the same layer and with the same material, without significant change of the existing backplane fabricating process. The voltage signal of the initializing voltage input line in the backplane fabricated by the method is stable, which can significantly alleviate the horizontal stripe mura in the OLED.

According to an embodiment of the present disclosure, the method includes: providing a wiring structure and a thin film transistor on a substrate, wherein the wiring structure includes an initializing voltage input line, and the initializing voltage input line and electrodes of the thin film transistor are formed through same one patterning process. As such, the initializing voltage input line and the electrodes of the thin film transistor can be easily fabricated in the same layer and with the same material, thereby reducing the fabrication cost. The backplane fabricated by the method can significantly alleviate the horizontal stripe mura in the OLED. According to embodiments of the present disclosure, the specific manner of the patterning process is not particularly limited, so long as it is satisfied that the initializing voltage input line and the electrodes of the thin film transistor are formed in the same layer and made of the same material.

According to embodiments of the present disclosure, the specific material for forming the substrate is not particularly limited, and those skilled in the art can make selection according to actual needs. For example, according to a specific embodiment of the present disclosure, the substrate may be made of glass. According to embodiments of the present disclosure, the specific features, structures, materials, or characteristics of the wiring structure and the thin film transistor are not particularly limited, so long as it is satisfied that the initializing voltage input line in the wiring structure and the electrodes of the thin film transistor are formed through same one patterning process.

According to an embodiment of the present disclosure, the electrodes of the thin film transistor include a control electrode, a first electrode, and a second electrode. According to an embodiment of the present disclosure, the initializing voltage input line and the first electrode, the second electrode, or the control electrode are formed through same one patterning process. According to a specific embodiment of the present disclosure, the first electrode and the second electrode are provided in the same layer, and the initializing voltage input line and the first electrode and the second electrode are formed through the same one patterning process; or, according to an embodiment of the present disclosure, the initializing voltage input line and the control electrode are formed through the same one patterning process. As such, the initializing voltage input line can be easily fabricated and the resistivity thereof is small, so that the occurrence of horizontal stripe mura can be avoided.

According to embodiments of the present disclosure, the specific materials for forming the first electrode and the second electrode have been previously described in detail and will not be repeated herein. According to an embodiment of the present disclosure, when the initializing voltage input line is fabricated in the same layer and with the same material as the first and second electrodes, the initializing voltage input line may have the same features, structure, material, or characteristic as the first and second electrodes. According to embodiments of the present disclosure, specific materials for forming the control electrode have been previously described in detail and will not be repeated again herein. According to an embodiment of the present disclosure, when the initializing voltage input line and the control electrode are fabricated in the same layer and with the same material, the initializing voltage input line may have the same features, structure, material, or characteristics as the control electrode.

In order to further improve the performance of the backplane fabricated by the method, according to an embodiment of the present disclosure, the backplane further includes an organic light emitting diode which is provided on the substrate. The wiring structure further includes a reference voltage input line, and the reference voltage input line and the anode of the organic light emitting diode are formed through same one patterning process. As such, the reference voltage input line and the initializing voltage input line can be easily layered. According to embodiments of the present disclosure, the specific manner of the patterning process is not particularly limited, so long as it is satisfied that the reference voltage input line and the anode of the organic light emitting diode are formed in the same layer and by the same material.

In the existing backplane for an OLED display apparatus, the reference voltage input line is usually provided in the same layer as the source and drain of the thin film transistor. According to an embodiment of the present disclosure, the reference voltage input line and the anode are provided in the same layer and made of the same material, so that the reference voltage input line and the initializing voltage input line can be made layered. Therefore, when the backplane is used for manufacturing a high-resolution product, the reference voltage input line and the initializing voltage input line can be made partially overlapped or completely overlapped in a direction perpendicular to the substrate, so that the footprint area of the wiring structure may be reduced in case of dense pixel arrangement, further increasing the opening ratio of the OLED. In addition, the current applied to the reference voltage input line is small, and thus the resistance of the wire itself has little influence on the voltage of the circuit and will not cause a significant fluctuation of the circuit voltage, so that even if the reference voltage input line is formed using an anode layer material with a large resistance, the performance of the backplane will not be adversely affected.

According to embodiments of the present disclosure, the specific features, structures, materials, or characteristics of the organic light emitting diode are not particularly limited, so long as it is satisfied that the reference voltage input line and the anode of the organic light emitting diode are provided in the same layer and made of the same material. According to embodiments of the present disclosure, the specific materials for forming the anode and the reference voltage input line have been described in detail above, and will not be repeated herein.

In summary, with the method the initializing voltage input line and the electrodes of thin film transistor can be easily fabricated in the same layer and with the same material, without significant change of the existing backplane fabricating process. The voltage signal of the initializing voltage input line in the backplane fabricated by the method is stable, which can significantly alleviate the horizontal stripe mura in the OLED.

As used in the description of the present disclosure, the terms "upper", "lower", and the like indicate the position or positional relationship based on the oriental or positional relationship shown in the drawings, are merely for facilitating the description of the present disclosure rather than requiring that the present disclosure must be configured and operated in the specific orientation, and accordingly are not to be construed as limiting the present disclosure.

As used in the description of the present disclosure, the description referring to the terms "an embodiment", "another embodiment" and the like means that the specific features, structures, materials or characteristics described in connection with the embodiment are included in at least one embodiment of the present disclosure. In this disclosure, the schematic representation of the above terms does not necessarily refer to the same embodiment or example. Furthermore, the described particular features, structures, materials, or characteristics may be combined in any suitable manner in any one or more of the embodiments or examples. In addition, those skilled in the art may combine and compose the different embodiments or examples described in this disclosure and features of different embodiments or examples without conflicting with each other. In addition, it should be noted that as used in this disclosure, the terms "first" and "second" and the like are used for purpose of description only, and cannot be interpreted as indicating or implying relative importance or implicitly indicating number of indicated technical features.

Although embodiments of the present disclosure have been shown and described above, it will be understood that the above embodiments are exemplary and are not to be construed as limiting the present disclosure, and that those skilled in the art may make variations, modifications, substitutions and changes to the above embodiments within the scope of the present disclosure.

What is claimed is:

1. A backplane for an organic light emitting display device, comprising:
   a substrate,
   an initializing voltage input, a reference voltage input line, a thin film transistor, and an organic light emitting diode, disposed on the substrate,
   wherein the thin film transistor comprises a first electrode connected to a first electrode line, a second electrode connected to a second electrode line, and a control electrode connected to a control electrode line,
   wherein the initializing voltage input line is provided in the same layer and is made of the same material as one of the first electrode, the second electrode and the control electrode of the thin film transistor and one of the first electrode line, the second electrode line and the control electrode line to which the one of the first electrode, the second electrode and the control electrode is connected,
   wherein the reference voltage input line is provided in the same layer and is made of the same material as an anode of the organic light emitting diode, and
   wherein the initializing voltage input line and the reference voltage input line are provided in different layers.

2. The backplane according to claim 1, wherein the first electrode is formed of at least one of titanium, chromium, molybdenum, tantalum, and aluminum, the second electrode is formed of at least one of titanium, chromium, molybdenum, tantalum, and aluminum.

3. The backplane according to claim 1, wherein the control electrode is formed of at least one of titanium, chromium, molybdenum, and tantalum.

4. An organic light emitting display apparatus, comprising a backplane according to claim 1.

5. The backplane according to claim 1, wherein the first electrode is a source, the second electrode is a drain, and the control electrode is a gate.

6. The backplane according to claim 1, wherein the initializing voltage input line is provided in the same layer and is made of the same material as the first electrode and the second electrode.

7. The backplane according to claim 1, wherein the initializing voltage input line is provided in the same layer and is made of the same material as the control electrode.

* * * * *